(12) United States Patent
Kang et al.

(10) Patent No.: US 7,615,865 B2
(45) Date of Patent: Nov. 10, 2009

(54) STANDOFF HEIGHT IMPROVEMENT FOR BUMPING TECHNOLOGY USING SOLDER RESIST

(75) Inventors: TaeWoo Kang, Kyoung-gi-Do (KR); YoRim Lee, Kyoung-gi-Do (KR); TaeKeun Lee, Kyoung-gi-Do (KR)

(73) Assignee: STATS ChipPAC, Ltd., Fremont, CA (US)

( * ) Notice: Subject to any disclaimer, the term of this patent is extended or adjusted under 35 U.S.C. 154(b) by 109 days.

(21) Appl. No.: 11/751,440

(22) Filed: May 21, 2007

(65) Prior Publication Data

US 2008/0293232 A1    Nov. 27, 2008

(51) Int. Cl.
*H01L 23/48* (2006.01)

(52) U.S. Cl. ............... 257/737; 438/612; 257/E21.508

(58) Field of Classification Search .......... 257/737, 257/738, 778, 779, 780, E23.023, E23.026, 257/E23.021, E21.508, E21.509; 438/612
See application file for complete search history.

(56) References Cited

U.S. PATENT DOCUMENTS

| | | | |
|---|---|---|---|
| 5,346,118 A * | 9/1994 | Degani et al. .......... 228/180.22 |
| 5,400,950 A | 3/1995 | Myers et al. |
| 5,672,542 A * | 9/1997 | Schwiebert et al. ............. 438/4 |
| 5,985,682 A * | 11/1999 | Higgins, III .................. 438/10 |
| 6,261,941 B1 * | 7/2001 | Li et al. ....................... 438/618 |
| 6,426,548 B1 * | 7/2002 | Mita et al. ................... 257/673 |
| 6,507,121 B2 * | 1/2003 | Huang ......................... 257/780 |
| 6,787,921 B2 | 9/2004 | Huang |
| 7,276,801 B2 * | 10/2007 | Dubin et al. ................. 257/779 |
| 2003/0168739 A1 * | 9/2003 | Huang ......................... 257/738 |
| 2004/0166660 A1 * | 8/2004 | Yamaguchi .................. 438/613 |
| 2004/0232561 A1 * | 11/2004 | Odegard ...................... 257/778 |
| 2006/0060956 A1 * | 3/2006 | Tanikella ..................... 257/686 |
| 2006/0220244 A1 * | 10/2006 | Lu et al. ...................... 257/738 |
| 2006/0237828 A1 * | 10/2006 | Robinson et al. ............. 257/678 |

* cited by examiner

*Primary Examiner*—Thao P. Le
(74) *Attorney, Agent, or Firm*—Robert D. Atkins (57) ABSTRACT

A system to support a die includes a substrate. A solder resist is disposed over the substrate. A first solder bump is disposed in the solder resist to provide electrical connectivity through the solder resist to the substrate. A second solder bump is formed over the solder resist to correspond with a peripheral edge or a corner of the die. The second solder bump provides standoff height physical support to the die.

21 Claims, 6 Drawing Sheets

STANDOFF HEIGHT IMPROVEMENT FOR BUMPING TECHNOLOGY USING SOLDER RESIST

FIELD OF THE INVENTION

The present invention relates in general to electronic devices and, more particularly, to a standoff height improvement for bumping technology using a solder resist material.

BACKGROUND OF THE INVENTION

Semiconductors, or computer chips, are found in virtually every electrical product manufactured today. Chips are used not only in very sophisticated industrial and commercial electronic equipment, but also in many household and consumer items such as televisions, clothes washers and dryers, radios, and telephones. As products become smaller but more functional, there is a need to include more chips in the smaller products to perform the functionality. The reduction in size of cellular telephones is one example of how more and more capabilities are incorporated into smaller and smaller electronic products.

A so-called "flip chip" is generally a monolithic semiconductor device, such as an integrated circuit, having bead-like terminals formed on one surface of the chip. The terminals serve to both secure the chip to a circuit board and electrically connect the flip chip's circuitry to a conductor pattern formed on the circuit board, which may be a ceramic substrate, printed wiring board, flexible circuit, or a silicon substrate. Due to the numerous functions typically performed by the microcircuitry of a flip chip, a relatively large number of terminals are required.

Because of the fine patterns of the terminals and conductor pattern, soldering a flip chip to a conductor pattern requires a significant degree of precision. Reflow solder techniques are widely utilized in the soldering of flip chips. Such techniques typically involve forming solder bumps on the surface of the flip chip using methods such as electrodeposition, by which a quantity of solder is accurately deposited on one surface of the flip chip. Heating the solder above a melting temperature serves to form the characteristic solder bumps. The chip is then soldered to the conductor pattern by registering the solder bumps with respective conductors, and reheating or reflowing the solder so as to metallurgically and electrically bond the chip to the conductor pattern.

Deposition and reflow of the solder must be precisely controlled not only to coincide with the spacing of the terminals and the size of the conductors, but also to control the height of the solder bumps after soldering. As is well known in the art, controlling the height of solder bumps after reflow is necessary in order to prevent the surface tension of the molten solder bumps from drawing the flip chip excessively close to the substrate during the reflow operation. Sufficient spacing between the chip and its substrate is necessary for enabling stress relief during thermal cycles, allowing penetration of cleaning solutions for removing undesirable residues, and enabling the penetration of mechanical bonding and encapsulation materials between the chip and the substrate.

A variety of methods are known in the art for controlling solder bump height. For example, the size of the exposed conductor area to which the solder bump is allowed to reflow can be limited. The approach involves the use of a solder stop, such as a solder mask or a printed dielectric mask, which covers or alters the conductor in the bump reflow region in order to limit the area over which the solder bump can reflow. A variation of the approach involves containing an I/O solder bump between and within a pair of recesses formed in the flip chip surface and the opposing surface of a substrate.

While several techniques for limiting and controlling height are accepted and used in the art, certain shortcomings remain.

SUMMARY OF THE INVENTION

A need exists for an apparatus, method and system which more effectively and precisely controls bump height. Ideally, an approach should make use of current materials in order to render an implementation more cost-effective.

Accordingly, in one embodiment, the present invention is a method of controlling a standoff height in a semiconductor device having an integrated die with a peripheral edge, comprising providing a substrate, depositing a solder resist film laminate layer over the substrate, forming an opening in the solder resist film laminate layer, depositing a metal plate in the opening, forming a first solder bump over the plate, and forming a second solder bump over the solder resist to correspond to the peripheral edge of the die.

In another embodiment, the present invention is a semiconductor device to support an integrated die having a peripheral edge, comprising a substrate, a solder resist film laminate disposed over the substrate, an opening formed in the solder resist film laminate layer, a metal plate deposited in the opening, a first solder bump formed over the plate, and a second solder bump formed over the solder resist to correspond to the peripheral edge of the die.

In still another embodiment, the present invention is a system to support a die, comprising a substrate, a solder resist disposed over the substrate, a first solder bump disposed in the solder resist to provide electrical connectivity through the solder resist to the substrate, and a second solder bump formed over the solder resist to correspond with a peripheral edge or a corner of the die, the second solder bump providing standoff height physical support to the die.

In still another embodiment, the present invention is a method of manufacturing a system to support a die, comprising providing a substrate, providing a solder resist disposed over the substrate, providing a first solder bump disposed in the solder resist to provide electrical connectivity through the solder resist to the substrate, and providing a second solder bump formed over the solder resist to correspond with a peripheral edge or a corner of the die, the second solder bump providing standoff height physical support to the die.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Figure 1:
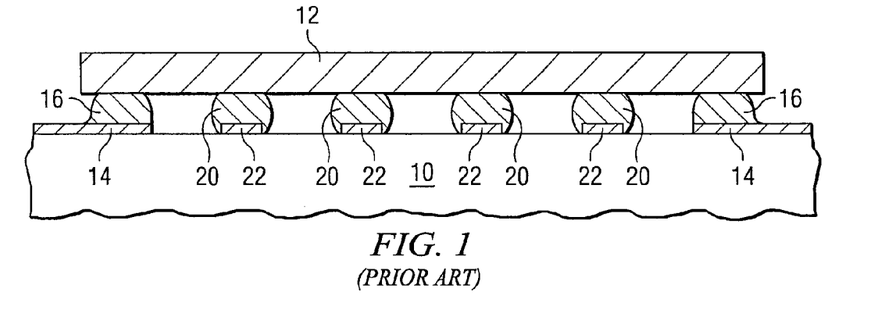
FIG. 1 illustrates an exemplary prior art method for controlling solder bump height for flip chip integrated circuit devices.

Turning to FIG. 1, an exemplary prior art method for controlling solder bump height in a flip chip integrated circuit device is illustrated. A circuit board 10 is connected to a mounted flip chip 12. A conductor structure 14 is deposited above the board 10 as shown. A solder bump 16 electrically couples the conductor 14 to the chip 12. A series of "dummy bumps" 20 are formed interiorly to the working bumps 16 as shown. Dummy bumps 20 are intended to overcome a tendency for the working bumps 16 to draw the flip chip 12 excessively close to the circuit board 10. The dummy bumps 20 are mounted to the substrate 10 in the same manner as the working bumps 16.

Figure 2:
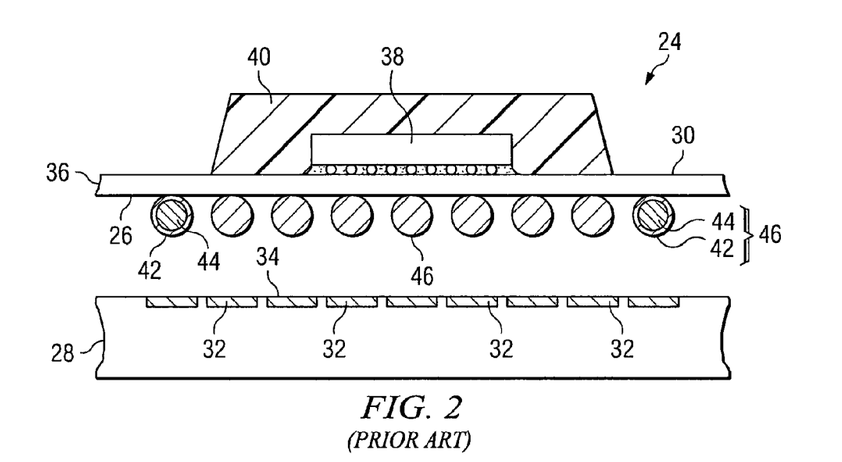
FIG. 2 illustrates an exemplary prior art array structure of solder balls.

A second exemplary prior art method and apparatus 24 for controlling solder bump height is illustrated in FIG. 2. A substrate 28 includes a first surface 34. Pads 32 are provided on the first surface 34 of the substrate 28. A carrier 36 includes an active surface 26 and a back surface 30 opposite of the surface 26. Dies 38 are provided on the back surface 30 of the carrier 36 by flip chip technology. A molding compound 40 encapsulates the back surface 30 of the carrier 36 and the dies 38. Solder balls 46 are provided on the active surface 26 of the carrier 36 in an array layout. At least three solder balls 46 are coated with a base material 42, which has a lower melting point than a high melting temperature (HMT) core 44 of the solder balls 46.

Because the solder balls 46 having the base material 42 has a lower melting point than the HMT core 44, the HMT core 44 can maintain the distance between the carrier 36 and the substrate 28 and allow wetting of the solder balls 46 and the pads 32 of the substrate 28 when the base material 42 starts to melt. The collapse of the solder balls is controlled by the arrangement of the three solder balls 46 having HMT cores 44.

The present invention represents an improvement over the methods and techniques depicted in FIGS. 1 and 2 for controlling standoff height in bumping technology, for example in the use of flip chip semiconductor devices.

Figure 3:
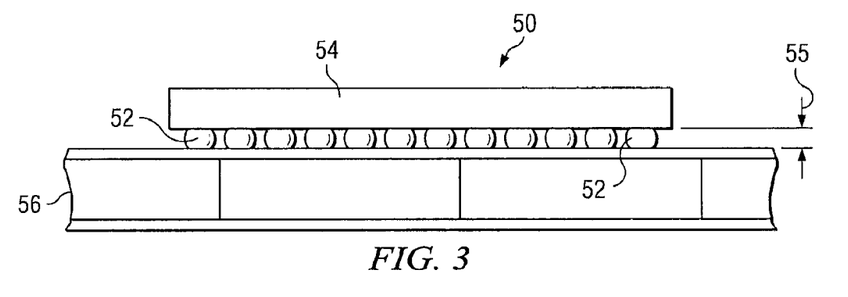
FIG. 3 illustrates a conventional flip chip attachment scheme using a plurality of solder balls.

FIG. 3 illustrates a conventional technique used in flip chip semiconductor devices 50, in order to better illustrate the improvement as will be described. As seen, an array of solder balls 52 is used to attach the die 54 to the substrate 56. The standoff height 55 of the die 54 refers to the final distance 55 between the die 54 and the substrate 56 after the die 54 is reflowed. Standoff height 55 is typically 70%-90, depending upon the respective bump alloy, of the bump 52 height.

Standoff height 55 is an important characteristic of a semiconductor device such as a flip chip device, because each of the solder bumps 52 is the mechanical connection for the die 54. Additionally, each of the solder bumps 52 can be the electrical connection for the die 54. If the standoff height 55 is too high (for example, greater than 100 um), the interconnection between die 54 and substrate 56 may be more subject to electrical losses and poor flow of underfill material. If the standoff height 55 is too low (for example, under 50 um), then the possibility arises of residues from processing (e.g., flux) remaining beneath the die 54 and causing degradation of the device 50. Additionally, the underfill process becomes more difficult, and fatigue stresses of various subcomponents of the device 50 are higher.

The configurations, methods and techniques illustrated according to the present invention allow for a standoff height to be maintained which is higher than the conventional standoff height 55 previously seen. A higher standoff height results in a higher-reliability package. In addition, underfill flow is better facilitated.

Figure 4A:
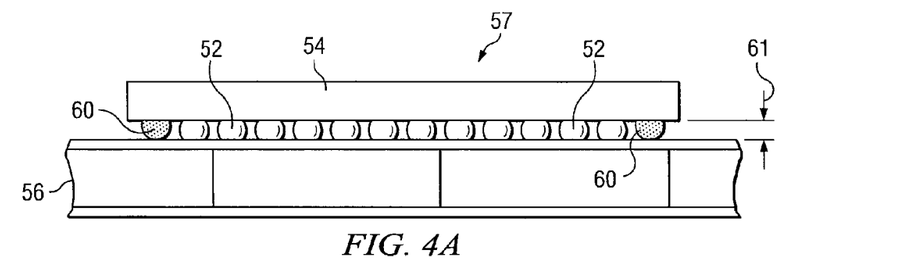
FIG. 4A illustrates an exemplary flip chip attachment scheme.

Turning to FIG. 4A, a method 57 of maintaining a higher standoff height 61 is depicted in a side-view representation. A substrate is electrically connected to a die 54 through an array of solder balls 52 in a manner similar to the array shown in FIG. 3, previously. However, a series of standoff solder bumps 60, not electrically connected to the die, are disposed along a peripheral edge of the die, or disposed near peripheral corners of the die as will be seen. The standoff solder bumps 60 are not disposed interiorly to working bumps 52, as shown in the prior art.

Bumps 60 do not use a coating technology to provide standoff height resistance as previously described. Instead, bumps 60 can be generally manufactured using the same material as bumps 52, which saves manufacturing resources and lowers overall cost. Finally, instead of being placed on solder paste or metal materials as described in the prior art, the bumps 60 are disposed over a solder resist material, which will be further described.

Figures 4B, 4C:
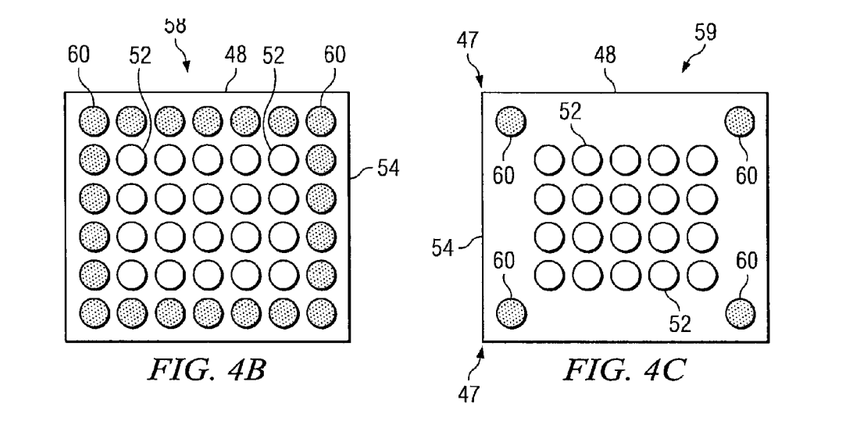
FIG. 4B illustrates a first exemplary configuration of solder balls corresponding to a surface of a die.
FIG. 4C illustrates a second exemplary configuration of solder balls corresponding to a surface of a die.

Turning to FIG. 4B, a top-view representation 58 of a first configuration of solder balls 60 along peripheral surfaces 48 of a die 54 is seen. Working bumps 52 are disposed interiorly to bumps 60. Bumps 60 are located along each peripheral surface 48 of the die 54 Bumps 60 are disposed over the substrate and correspond to the peripheral surfaces 48 of the die 54 as shown when the die 54 is attached to the substrate.

A second configuration 59 of solder balls 60 in a top-view representation is seen in FIG. 4C. The bumps 60 are disposed near each peripheral corner 47 of the die 54. Here, as before, the working bumps 52 are disposed interiorly to the bumps 60. As one skilled in the art will appreciate, additional configurations where bumps 60 are disposed to correspond near peripheral surfaces 48 or corners 47 of die 54 are contemplated.

Figure 5:
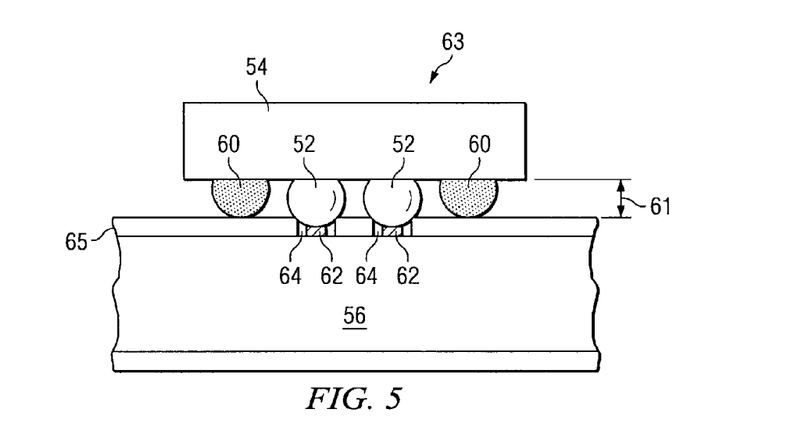
FIG. 5 illustrates a close-up view of an exemplary attachment scheme with additional solder balls providing standoff height support to a die.

FIG. 5 illustrates a closer side-view representation 63 of working bumps 52 and standoff bumps 60 disposed over a substrate 56 as seen in FIG. 4A. An opening 64 is formed in solder resist material 65, where a metal conductor 62 such as an under bump metallization (UBM) 62 electrically connects the die 54 with the substrate 56. In contrast, the standoff bumps 60 are disposed outwardly of the working bumps 52. The standoff height 61 can be directly maintained by varying a respective dimension (e.g., diameter) of the bumps 60.

Figure 6A:
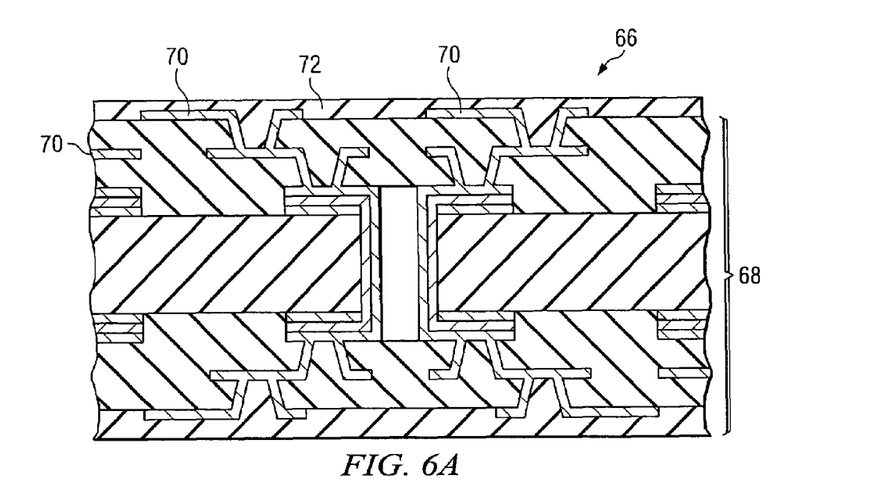
FIG. 6A illustrates a first step in an exemplary method of manufacturing a system to provide improved standoff height support in semiconductor devices.

Turning to FIG. 6A, a first step 66 in an exemplary method of manufacturing a semiconductor device to maintain a standoff height is depicted. A substrate 68 is provided which includes a variety of layers which are deposited for a particular application. The layers can include a conductive portion 70 which can be intended to move electrical signals through the substrate 68 in a particular manner or fashion. A solder resist film laminate layer 72 is deposited over the substrate 68 as shown. The solder resist layer 72 can be deposited using tools, methods and techniques known in the art.

The layer 72 can be a photosensitive resin film. In one embodiment, the film can be a monolayer film including a cyclized product of butadiene polymer, a photo-crosslinking agent, a photo-sensitizer and a photo-polymerization initiator, and a storage stabilizer, and if necessary, a dye and/or a pigment. In another embodiment, the layer 72 can be manufactured using a liquid-phase curable resin. Components of the liquid-phase curable resin can include an epoxy-type resin for small curing shrinkage and reliability characteristics. The epoxy type resins to be employed may include, for example, bisphenol type epoxy resins, phenol type epoxy resins, cresol type epoxy resins, and the like. The resins may be mixed with a catalyst for curing by heat or UV rays, a filler, a defoaming agent, and the like. As one skilled in the art would expect, however, the layer 72 can include a variety of materials, which are suited for a particular application.

Figure 6B:
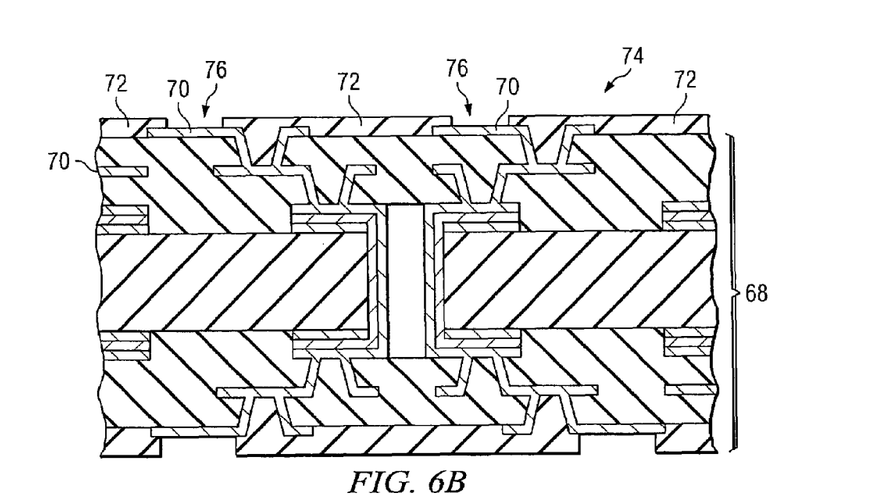
FIG. 6B illustrates a second step in the exemplary method shown in FIG. 6A.

FIG. 6B illustrates a second step 74 in the method of manufacture begun with FIG. 6A. A series of openings 76 are formed in the solder resist layer 72 to expose the conductive portion 70. The solder resist layer 72 can be subjected to an exposure and development process to form the openings 76. Once the openings 76 are formed, the layer 72 can be subjected to a thermal cure process, for example, to cure the epoxy. Following the thermal cure process, the layer 72 can undergo a surface roughening process using a variety of chemicals known in the art.

Figure 6C:
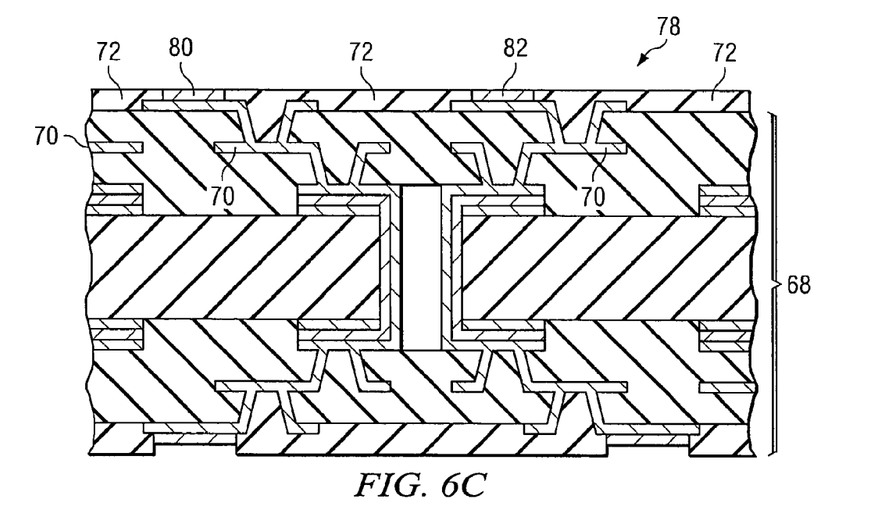
FIG. 6C illustrates a third step in the exemplary method shown in FIG. 6A.

FIG. 6C illustrates a third step 78 in the method of manufacture begun with FIG. 6A. A series of conductive metal plates, such as under bump metallizations (UBMs) 80 and 82 are formed in the openings 76 as shown. The metal plates 80 and 82 provide for electrical connectivity to a working solder bump. In one embodiment, the metal plate 80 can include a nickel (Ni) material. Similarly, metal plate 82 can include a gold (Au) material. The process used to create the metal plates 80 and 82 can include an electroless plating process.

Figure 6D:
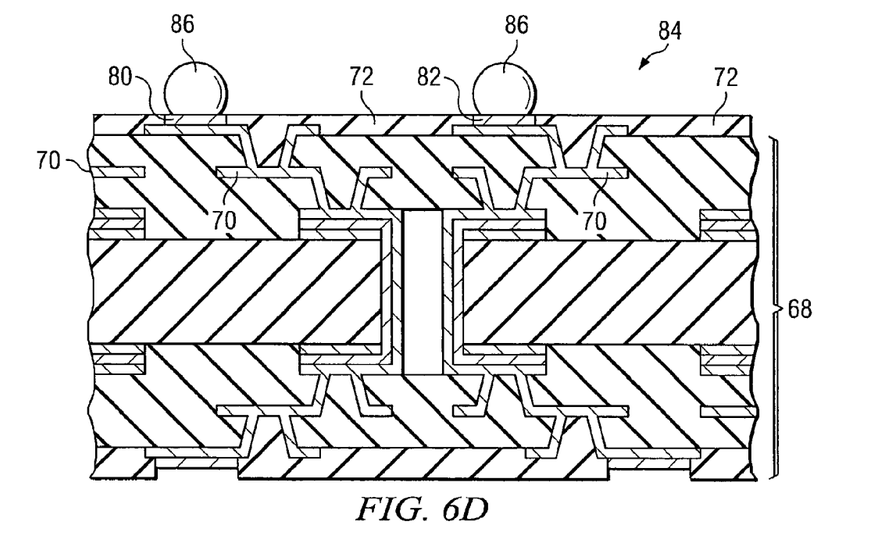
FIG. 6D illustrates a fourth step in the exemplary method shown in FIG. 6A.

FIG. 6D illustrates a fourth step 84 where a series of working solder bumps 86 is disposed over the UBMs 80 and 82 as shown. Here again, tools and techniques known in the art can be utilized to form the plates 80, 82 and the working bumps 86. In one embodiment, the bumps 86 can be comprised of a eutectic solder material including 63% strontium (Sr) and 37% lead (Pb), having an associated melting point of 183 degrees Celcius (C.), which is selected for ease of flow characteristics.

Figure 6E:
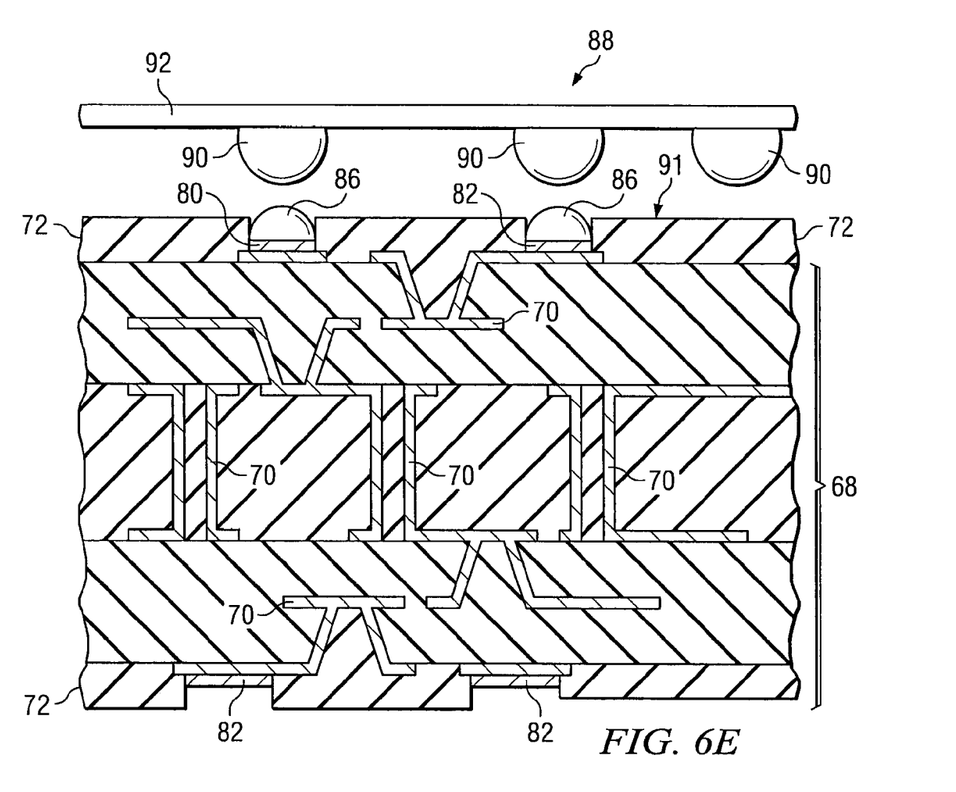
FIG. 6E illustrates a fifth step in the exemplary method shown in FIG. 6A.

As a next step 88, FIG. 6E illustrates the deposition of a standoff bump 90 which is deposited at location 91. Location 91 is intended to correspond to a peripheral edge or corner of a die as seen in previously shown FIGS. 4B and 4C or in accordance with other configurations. In one embodiment, standoff bumps 90 are temporarily connected to a film 92, which is used to transport the bumps to the substrate 68. The film 92 can be pressed to deposit the bump 90 on the solder resist 72 at location 91 as shown.

In other embodiments, the bump 90 can be deposited using a variety of methods and techniques known in the art, such as use of conventional flip chip bonding techniques. Here, as before, bump 90 can include the same solder material as utilized in working bumps 86.

In summary, an example manufacturing process A for rendering a bumped semiconductor structure can include, first, providing a substrate. A solder resist film laminate layer can be deposited over the substrate. An opening can be formed in the solder resist film laminate layer to correspond with working solder bumps. A metal plate structure, such as an UBM, can be deposited in the opening in the solder resist. A first solder bump can be formed over the metal plate to render a working solder bump. A second solder bump can then be formed, directly over the solder resist layer, to correspond to the peripheral edge of a die. Once the working bumps and standoff bumps have been deposited, the die can then be connected to the substrate.

Figure 7A:
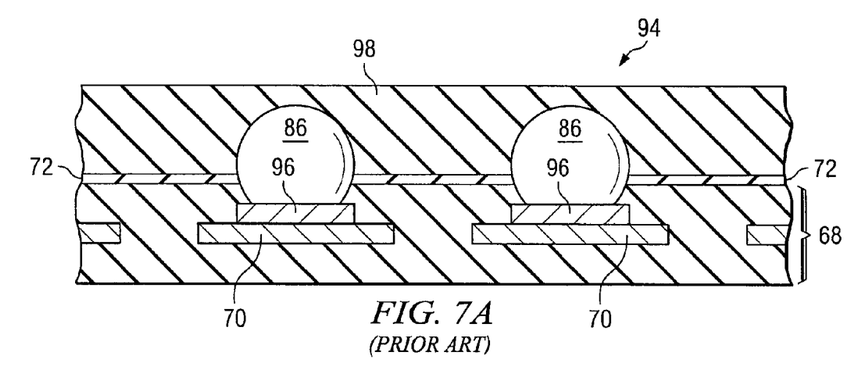
FIG. 7A illustrates a conventional bumping technology.

FIG. 7A illustrates a conventional, prior art illustration of a bumped semiconductor device 94 in a cutaway representation. Device 96 includes a plurality of working bumps 86 which is disposed over a pad 96 or an organic solderability protective (OSP) structure 96 on a substrate 68. A metal conductive layer 70 is disposed below the pad 96 or OSP 96 to carry electric signals according to a particular application. A layer 98 functions as an encapsulant or an underfill material to protect the working bumps 86.

Figure 7B:
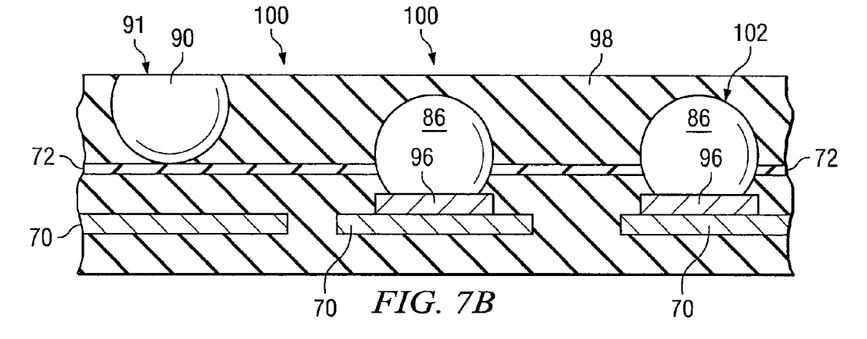
FIG. 7B illustrates an exemplary bumping technology to provide improved standoff height support in semiconductor devices.

FIG. 7B illustrates a method of controlling standoff height, according to the present invention, in a cutaway representation comparative to the conventional method depicted in FIG. 7A. Device 100 again includes working bumps 86 which are electrically connected to a substrate 68 through a pad 96 or OSP 96 disposed in a solder resist opening 102. An encapsulant 98 or underfill material 98 again protects the working bumps 86. At location 91, however, which is oriented to correspond to a peripheral edge of a die or a corner of a die, a standoff bump 90 is disposed directly over a solder resist layer 72.

Bump 90 is composed of the same solder material as bumps 86. In one embodiment, the bumps 90 and 86 are composed of 97% lead (Pb) and 3% strontium (Sr). For such a solder alloy, the melting point is approximately 320 degrees Celsius (C.). As a result, the bump 90 does not melt on the solder resist layer 72 during subsequent processing steps on the device 100.

In further embodiments, solder alloys having 63% strontium (Sr) and 37% lead (Pb) can be utilized. Here again, the melting point of such a solder alloy is high enough that the solder bumps 86 and 90 will not melt on the solder resist layer 72 during subsequent processing steps on the device 100.

Here again, bump 90 does not use a coated bump as per the prior art. Because the same material is used for bump 90, overall cost can be reduced as extra manufacturing steps and resource allocations are limited.

Although bumps 90 are implemented using the same solder alloy material as found in bumps 86, the bumps 90 are placed on the solder resist layer 72 and not over a metal conductor 96 in a solder resist opening 102, as the working bumps 86 are. Since the standoff bumps 90 do not contact solder paste or metal materials during processing steps, the solder bumps 90 can maintain shape characteristics during a solder reflow process.

Devices such as device 100 provide an effective, cost-efficient method of controlling standoff height. A series of standoff bumps are placed to correspond to a periphery of a die. The standoff bumps are constructed using the same material as working bumps, which are disposed interiorly of the standoff bumps. The standoff bumps are disposed directly over a solder resist layer. Since the standoff bumps are not connected to metal or solder materials, the standoff bumps maintain shape during solder reflow. A standoff height, which is higher than a standoff height achieved using conventional methods, is obtained. Underfill flow is better facilitated. A higher reliability semiconductor device 100 and eventual semiconductor package, such as a flip chip semiconductor package, results.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a substrate containing a conductive layer;
   a solder resist film laminate layer disposed over the substrate and conductive layer;
   an opening formed in the solder resist film laminate layer to expose the conductive layer, the solder resist film laminate layer being cured after the opening is formed;
   an under bump metallization (UBM) layer formed over the conductive layer;
   a plurality of first solder bumps formed over the UBM layer to promote reflow of the first solder bumps at a eutectic temperature;
   a plurality of standoff solder bumps formed directly on the solder resist film laminate layer around a perimeter of the substrate, the solder resist film laminate layer preventing reflow of the standoff solder bumps at the eutectic temperature;
   a semiconductor die; and
   a plurality of second solder bumps disposed between the semiconductor die and the first solder bumps of the substrate, the second solder bumps being reflowed to electrically connect the semiconductor die to the first solder bumps of the substrate, wherein after reflow of the second solder bumps the standoff solder bumps have a height 70-90% of a height of the second solder bumps prior to reflow to maintain a predetermined separation between the semiconductor die and substrate.

2. The semiconductor device of claim 1, wherein the solder resist film laminate layer includes a photosensitive resin film or liquid-phase curable resin.

3. The semiconductor device of claim 2, wherein the photosensitive resin film includes butadiene polymer, photo-crosslinking agent, photo-sensitizer, photo-polymerization initiator, and storage stabilizer.

4. The semiconductor device of claim 2, wherein the liquid-phase curable resin includes bisphenol type epoxy resin, phenol type epoxy resin, or cresol type epoxy resin.

5. The semiconductor device of claim 4, wherein the liquid-phase curable resin is mixed with a catalyst, filler, and defoaming agent and cured by heat or ultraviolet radiation.

6. The semiconductor device of claim 1, wherein the first solder bumps and standoff solder bumps each include a eutectic solder material.

7. A semiconductor device, comprising:
   a substrate containing a first conductive layer;
   a film layer disposed over the substrate and first conductive layer;
   an opening formed in the film layer to expose the first conductive layer;
   a second conductive layer formed over the first conductive layer;
   a first bump formed over the second conductive layer which promotes reflow of the first bump at a eutectic temperature;
   a standoff bump formed directly on the film layer around a perimeter of the substrate, the film layer preventing reflow of the standoff bump at the eutectic temperature;
   a semiconductor die; and
   a second bump disposed between the semiconductor die and the first bump of the substrate, the second bump being reflowed to electrically connect the semiconductor die to the first bump of the substrate, wherein after reflow of the second bump the standoff bump has a height at least 70% of a height of the second bump prior to reflow to maintain separation between the semiconductor die and substrate.

8. The semiconductor device of claim 7, wherein the film layer is cured after the opening is formed.

9. The semiconductor device of claim 7, wherein the film layer includes a photosensitive resin film or liquid-phase curable resin.

10. The semiconductor device of claim 9, wherein the photosensitive resin film includes butadiene polymer, photo-crosslinking agent, photo-sensitizer, photo-polymerization initiator, and storage stabilizer.

11. The semiconductor device of claim 9, wherein the liquid-phase curable resin includes bisphenol type epoxy resin, phenol type epoxy resin, or cresol type epoxy resin.

12. The semiconductor device of claim 11, wherein the liquid-phase curable resin is mixed with a catalyst, filler, and defoaming agent and cured by heat or ultraviolet radiation.

13. The semiconductor device of claim 7, wherein the first bump and standoff bump each include a eutectic solder material.

14. The semiconductor device of claim 7, wherein the semiconductor die is a flip chip type semiconductor die.

15. A semiconductor device, comprising:
    a substrate containing a first conductive layer;
    a film layer disposed over the substrate and first conductive layer;
    an opening formed in the film layer to expose the first conductive layer;
    a second conductive layer formed over the first conductive layer;
    a first bump formed over the second conductive layer which promotes reflow of the first bump at a eutectic temperature; and
    a standoff bump formed directly on the film layer around a perimeter of the substrate, the film layer preventing reflow of the standoff bump at the eutectic temperature to maintain a height of the standoff bump;
    a semiconductor die; and
    a second bump disposed between the semiconductor die and the first bump of the substrate, the second bump being reflowed to electrically connect the semiconductor die to the first bump of the substrate, wherein after reflow of the second bump the standoff bump has a height at least 70% of a height of the second bump prior to reflow to maintain separation between the semiconductor die and substrate.

16. The semiconductor device of claim 15, wherein the film layer is cured after the opening is formed.

17. The semiconductor device of claim 15, wherein the film layer includes a photosensitive resin film or liquid-phase curable resin.

18. The semiconductor device of claim 17, wherein the photosensitive resin film includes butadiene polymer, photo-crosslinking agent, photo-sensitizer, photo-polymerization initiator, and storage stabilizer.

19. The semiconductor device of claim 17, wherein the liquid-phase curable resin includes bisphenol type epoxy resin, phenol type epoxy resin, or cresol type epoxy resin.

20. The semiconductor device of claim 19, wherein the liquid-phase curable resin is mixed with a catalyst, filler, and defoaming agent and cured by heat or ultraviolet radiation.

21. The semiconductor device of claim 15, wherein the first bump and standoff bump each include a eutectic solder material.

* * * * *